United States Patent
Nakamori et al.

(10) Patent No.: US 7,592,853 B2
(45) Date of Patent: Sep. 22, 2009

(54) DRIVE CIRCUIT FOR INSULATED GATE DEVICE

(75) Inventors: Akira Nakamori, Nagano (JP); Kazunori Oyabe, Nagano (JP)

(73) Assignee: Fuji Electric Device Technology Co., Ltd, Tokyo (JP)

( * ) Notice: Subject to any disclaimer, the term of this patent is extended or adjusted under 35 U.S.C. 154(b) by 0 days.

(21) Appl. No.: 11/847,885

(22) Filed: Aug. 30, 2007

(65) Prior Publication Data
US 2008/0094111 A1    Apr. 24, 2008

(30) Foreign Application Priority Data
Oct. 18, 2006    (JP) .............................. 2006-283740

(51) Int. Cl.
*H03K 17/687* (2006.01)
(52) U.S. Cl. .................... 327/434; 327/427; 327/108
(58) Field of Classification Search ......... 327/108–112, 327/376, 377, 379, 389, 391, 427–434; 326/22–27, 326/82, 83, 86, 87
See application file for complete search history.

(56) References Cited

U.S. PATENT DOCUMENTS

| | | | | |
|---|---|---|---|---|
| 4,034,307 A | * | 7/1977 | Schade, Jr. ................. | 330/277 |
| 5,204,166 A | * | 4/1993 | Ito et al. ...................... | 428/209 |
| 5,619,163 A | * | 4/1997 | Koo ............................. | 327/539 |
| 6,208,185 B1 | | 3/2001 | John et al. | |
| 6,459,324 B1 | | 10/2002 | Neacsu et al. | |
| 7,151,401 B2 | * | 12/2006 | Inoue .......................... | 327/434 |
| 2005/0280440 A1 | | 12/2005 | Fukazawa et al. | |
| 2007/0247215 A1 | * | 10/2007 | Chen ........................... | 327/543 |

FOREIGN PATENT DOCUMENTS

| | | |
|---|---|---|
| JP | 2004-266368 A | 9/2004 |
| JP | 2004-280452 A | 10/2004 |
| JP | 2005-354586 A | 12/2005 |
| JP | 2007-166655 A | 6/2007 |

OTHER PUBLICATIONS

Specification, claims, and drawings of co-pending related U.S. Appl. No. 12/330,110, filed Dec. 8, 2008; Specification pp. 1-26, figures 1-6.

* cited by examiner

*Primary Examiner*—Lincoln Donovan
*Assistant Examiner*—Brandon S Cole
(74) *Attorney, Agent, or Firm*—Rossi, Kimms & McDowell, LLP

(57) ABSTRACT

A drive circuit for an insulated gate device includes a constant current source generating a constant current, and a switching circuit, wherein a gate of the insulated gate device is connected to a power supply potential side via the constant current source at the time of turn-on and to a ground potential side at the time of turn-off. Whereby a drive circuit for the insulated gate device can be reduced loss at the time of turn-on and reduced temperature dependency of noise.

8 Claims, 3 Drawing Sheets

DRIVE CIRCUIT FOR INSULATED GATE DEVICE

CROSS-REFERENCE TO RELATED APPLICATION

This application claims priority from Japanese Patent Application 2006-283740 filed on Oct. 18, 2006, the contents of which are incorporated herein by reference.

BACKGROUND OF THE INVENTION

The present invention relates to a drive circuit for an insulated gate device, and in particular to a drive circuit which is suitable for applying to a method for reducing loss of a drive circuit for an insulated gate device, and for reducing temperature dependency of noise due to an insulated gate device.

In a semiconductor power converter, insulated gate power devices such as an insulated gate bipolar transistor (IGBT), a power MOSFET and the like are used, and there is a method in which a drive circuit for driving these insulated gate power devices is made using an inverter configuration. FIG. 5 is a view showing the circuit configuration of a drive circuit of a conventional insulated gate device.

In FIG. 5, a P channel field effect transistor (hereinafter referred to as P-FET) 41 and an N channel field effect transistor (hereinafter referred to as N-FET) 42 are connected in series, and a source of the P-FET 41 is connected to a power supply voltage Vcc and a source of the N-FET 42 is connected to the ground potential. Drains of the P-FET 41 and the N-FET 42 are commonly connected to a gate of an IGBT 43 and a driving signal is commonly input into gates of the P-FET 41 and the N-FET 42.

When the IGBT 43 is turned on, the P-FET 41 is turned on by making the driving signal go to a low level, and at the same time the N-FET 42 is turned off. The power supply voltage Vcc is applied to the gate of the IGBT 43 via the P-FET 41. On the other hand, when the IGBT 43 is turned off, the P-FET 41 is turned off by making the driving signal go to a high level, and at the same time the N-FET 42 is turned on. The ground potential is applied to the gate of the IGBT 43 via the N-FET 42.

Here, on-resistance of the P-FET 41 and on-resistance of the N-FET 42 are used when the IGBT 43 is driven at the time of turn-on and at the time of turn-off respectively. In addition, for example, Japanese Patent Laid-Open No. 2005-354586, of which the corresponding foreign patent application is United States Patent Publication No. US2005/0280440A1, discloses that a pre-driver circuit includes a current mirror circuit which has a pair of transistors that are connected to a pre-driver power supply voltage, a level shifter circuit which is connected to a first transistor via a self-bias circuit and a discharge transistor which is connected to a second transistor, so that the pre-driver circuit is capable of reducing the size of a drive transistor while preventing a drive transistor's gate from being destroyed, thereby reducing power consumption.

However, in an intelligent power module (IPM), the insulated gate power device such as the IGBT 43 and the drive circuit are equipped in the same module. In addition, when the insulated gate power device and the drive circuit are equipped in the same module, the drive circuit which is near the insulated gate power device is put under a severe thermal environment because the operating temperature of the insulated gate power device is guaranteed to a maximum of 150° C.

Because on-resistance of the P-FET 41 and on-resistance of the N-FET 42 increase in a high temperature condition in comparison with room temperature condition, in the method in which the IGBT 43 is driven by using on-resistance of the P-FET 41 and on-resistance of the N-FET 42, the charging velocity of the gate of the IGBT 43 becomes late in the high temperature condition in comparison with the room temperature condition, and steep voltage variation (voltage between a collector and an emitter of the IGBT 43) is suppressed, so that generation of noise due to voltage variation decreases. However, there is a problem in that loss increases so that a time needed for the turn-on of the IGBT 43 increases. On the other hand, when the design is optimized for the high temperature condition in order to cause as little lose as possible, the charging velocity of the gate of the IGBT 43 is too fast at room temperature, and the voltage variation becomes steep, so that there is a problem that noise increases.

SUMMARY OF THE INVENTION

The invention addresses the problems discussed above, and aims to provide a drive circuit for an insulated gate device which can reduce loss at the time of turn-on and reduce temperature dependency of noise.

The invention provides a drive circuit for an insulated gate device which can reduce loss at the time of turn-on and reduce temperature dependency of noise, while solving the above problem. A drive circuit for an insulated gate device according to a first aspect of the invention is characterized by including a constant current source which generates a constant current, a switching circuit which a gate of the insulated gate device is connected to a power supply potential side via the constant current source at the time of turn-on and the gate of the insulated gate device is connected to a ground potential side at the time of turn-off, and a discharge circuit by which the insulated gate device is turned off. This makes it possible for the insulated gate device to turn on via the constant current source, and makes it possible to reduce temperature dependency of charging velocity of the gate of the insulated gate device. Because of this, while suppressing noise and loss at the time of turn-on in a high temperature condition, noise and loss can also be suppressed at room temperature.

The drive circuit for an insulated gate device according to a second aspect of the invention is characterized that, in the first aspect of the invention, the constant current source includes a first transistor of which a drain side is coupled to a resistor, a second transistor which is configured as a current mirror circuit along with the first transistor and which generates a constant current determined by the value of the resistor and a reference voltage and a third transistor which is configured as the current mirror circuit along with the second transistor and of which a drain is connected to the gate of the insulated gate device. By this, while amplifying the constant current determined by the value of the resistor and the reference voltage, the insulated gate device can be turned on, and while suppressing noise and loss at the time of turn-on in a high temperature condition, noise and loss can also be suppressed at a room temperature condition.

The drive circuit for an insulated gate device according to a third aspect of the invention is characterized that, in the second aspect of the invention, the constant current source includes a bias circuit which the voltage substantially according with a gate voltage of the insulated gate device is applied to a drain of the first transistor. Whereby, even when the gate voltage of the insulated gate device varies, current balance of the current mirror circuit of the first transistor and the third transistor can be maintained, and current flowing through the third transistor can be kept constant, so that the insulated gate device can be driven in a stable manner.

The drive circuit for an insulated gate device according to a fourth aspect of the invention is characterized that, in the third aspect of the invention, the constant current source further includes a fourth transistor which is configured as the current mirror circuit along with the first transistor and a fifth transistor which makes switching so that current flowing through the fourth transistor flows to the resistor based on the gate voltage of the insulated gate device. Because of this, even when the gate potential of the insulated gate device approaches the power supply potential side, current can flow to the resistor connected to the drain side of the first transistor, and it is possible to prevent overcurrent from flowing to the second transistor, so that the insulated gate device can be driven in a stable manner, while suppressing increase of consumption current.

The drive circuit for an insulated gate device according to a fifth aspect of the invention is characterized that, in the second aspect or the third aspect of the invention, the channel length of the first transistor to the third transistor is same substantially, and the channel width of the third transistor is equal to or more than ten times the channel width of the second transistor. By this, the insulated gate device can be turned on while amplifying the constant current determined by the value of the resistor and the reference voltage, and the insulated gate device can be driven in a stable manner, while reducing loss at the time of turn-on and reducing temperature dependency of noise.

The drive circuit for an insulated gate device according to a sixth aspect of the invention is characterized that, in the fourth aspect of the invention, the channel length of the first transistor to the fourth transistor is same substantially, and the channel width of the third transistor is equal to or more than ten times the channel width of the second transistor. By this, the insulated gate device can be turned on while amplifying the constant current determined by the value of the resistor and the reference voltage, and the insulated gate device can be driven stably, while reducing loss at the time of turn-on and reducing temperature dependency of noise.

The drive circuit for an insulated gate device according to a seventh aspect of the invention is characterized that, in any one of the second aspect through the sixth aspect of the invention, temperature characteristics of the resistor and the reference voltage are equal to or less than 100 ppm/° C. This makes it possible to reduce temperature dependency of a constant current which flows through the gate of the insulated gate device, and to reduce temperature dependency of charging velocity of the gate of the insulated gate device.

As discussed above, according to the invention the insulated gate device can be turned on via the constant current source, and while suppressing noise and loss at the time of turn-on in high temperature, noise and loss can be suppressed at room temperature, too.

BRIEF DESCRIPTION OF THE DRAWINGS

The invention will be described with reference to preferred embodiments and the accompanying drawings, where.

DETAILED DESCRIPTION OF THE PREFERRED EMBODIMENTS

Figure 1:
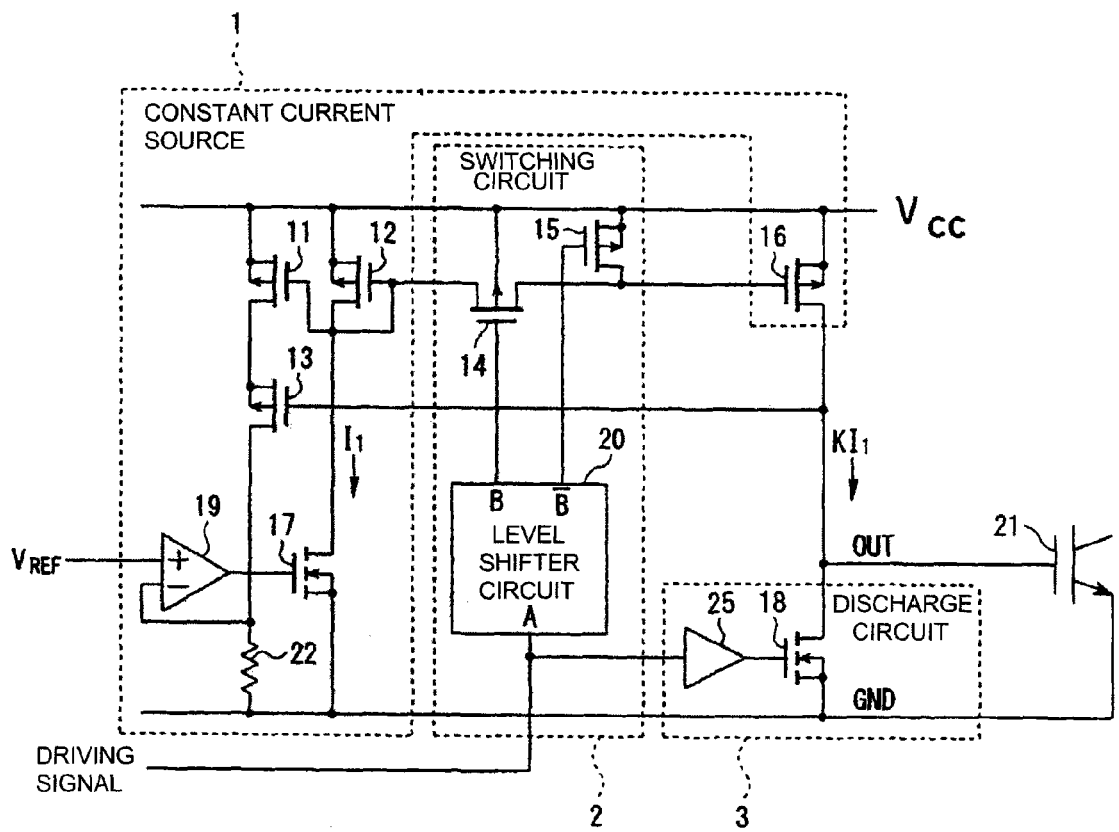
FIG. 1 is a view showing the circuit configuration of a drive circuit for an insulated gate device according to a first embodiment of the invention.

Preferred embodiments of a drive circuit for an insulated gate device according to the invention will be now explained with reference to the accompanying drawings. FIG. 1 is a view showing the circuit configuration of a drive circuit for the insulated gate device according to a first embodiment of the invention. While, by the following discussion, the IGBT is explained for example as the insulated gate device, a power MOSFET and the like other than the IGBT may be used as the insulated gate device. In FIG. 1, the drive circuit for an IGBT 21 includes a constant current source 1 generating a constant current, a switching circuit 2 which a gate of the IGBT 21 is connected to a power supply potential Vcc side at the time of turn-on and also the gate of the IGBT 21 is connected to a ground potential GND side at the time of turn-off and a discharge circuit 3 by which the IGBT 21 is turned off.

Here, the constant current source 1 includes a P-FET 11, a P-FET 12 and a P-FET 16 which are connected as a current mirror circuit. A source of the P-FET 11 is connected to the power supply potential Vcc, and a drain of the P-FET 11 is connected to a source of a P-FET 13. A drain of the P-FET 13 is connected to the ground potential GND via a resistor 22. In addition, a source of the P-FET 12 is connected to the power supply potential Vcc, and a drain of the P-FET 12 is connected to a drain of an N-FET 17. A source of the N-FET 17 is connected to the ground potential GND.

The gates of P-FETs 11 and 12 are commonly connected to the drain of the P-FET 12, and a gate of the P-FET 13 is connected to the gate of the IGBT 21. In addition, an output of an operational amplifier 19 is connected to a gate of the N-FET 17, and an inverting input terminal of the operational amplifier 19 is connected to the drain of the P-FET 13. A reference voltage $V_{REF}$ is input into a non-inverting input terminal of the operational amplifier 19.

In addition, the switching circuit 2 includes a level shifter circuit 20, a P-FET 14 and a P-FET 15. A source of the P-FET 14 is connected to the gate of the P-FET 12, and a drain of the P-FET 14 is connected to a gate of a P-FET 16. A source of the P-FET 15 is connected to the power supply potential Vcc, and a drain of the P-FET 15 is connected to the gate of the P-FET 16.

In addition, an output terminal B of the level shifter circuit 20 is connected to a gate of the P-FET 14, and an inverting output terminal $\overline{B}$ of the level shifter circuit 20 is connected to a gate of the P-FET 15. An input terminal A of the level shifter circuit 20 is connected to an input terminal of a buffer 25, and a driving signal is input into the input terminal A of the level shifter circuit 20 and the input terminal of the buffer 25.

Figure 2:
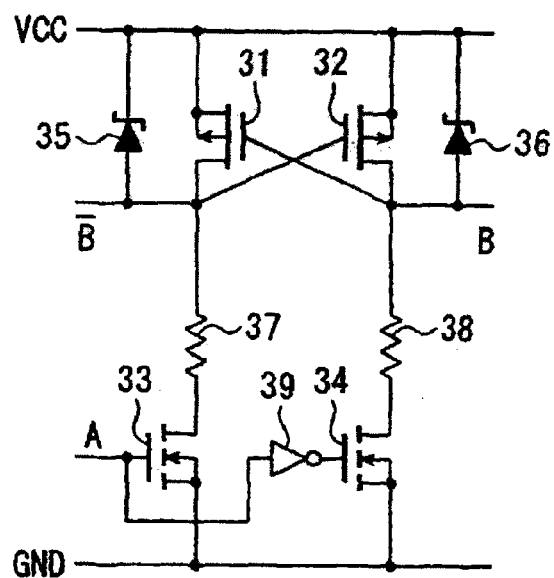
FIG. 2 is a view showing the circuit configuration of a level shifter circuit of FIG. 1.

FIG. 2 is a view showing the circuit configuration of the level shifter circuit of FIG. 1. In FIG. 2, Zener diodes 35 and 36 are connected to P-FETs 31 and 32 respectively, and sources of the P-FETs 31 and 32 are connected to the power supply potential Vcc. In addition, drains of the P-FETs 31 and 32 respectively are connected to drains of N-FETs 33 and 34 via resistors 37 and 38, and the drain of the P-FET 31 is connected to a gate of the P-FET 32, and the drain of the P-FET 32 is connected to a gate of the P-FET 31. In addition, sources of the N-FETs 33 and 34 are connected to the ground potential GND, and the input terminal A of the level shifter circuit 20 is connected to a gate of the N-FET 33. The input terminal A of the level shifter circuit 20 is connected to a gate of the N-FET 34 via an inverter 39.

When the driving signal is input into the input terminal A of the level shifter circuit 20, the driving signal is input into the gate of the N-FET 33, and into the gate of the N-FET 34 via the inverter 39. When the driving signal is at a high level, only the voltage drop of the Zener diode 35 is subtracted from the power supply potential Vcc is output from the drain of the P-FET 31. On the other hand, when the driving signal is at a low level, only the voltage drop of the Zener diode 36 is subtracted from the power supply potential Vcc is output from the drain of the P-FET 32.

In addition, in FIG. 1, the discharge circuit 3 includes an N-FET 18, and a gate of the N-FET 18 is connected to an output of the buffer 25. A drain of the N-FET 18 is connected to the gate of the IGBT 21, and a source of the N-FET 18 is connected to an emitter of the IGBT 21 via the ground potential GND.

In addition, it is preferable that the channel length of the P-FETs 11, 12 and 16 is substantially the same, and the channel width of the P-FET 16 is ten times more than that of the P-FET 12. In addition, it is preferable that a temperature characteristic of the resistor 22 and the reference voltage $V_{REF}$ is less than 100 ppm/° C. When the reference voltage $V_{REF}$ is input into the non-inverting input terminal of the operational amplifier 19, the voltage corresponding to difference between the reference voltage $V_{REF}$ and the voltage drop by the resistor 22 is input into the gate of the N-FET 17, and a current I1 which is determined unambiguously by (the reference voltage $V_{REF}$)/(the value of the resistor 22) flows through the P-FETs 11 and 12 which are configured as the current mirror circuit.

When the driving signal is changed to the low level, the output terminal B of the level shifter circuit 20 is changed to the low level, and the inverting output terminal $\overline{B}$ of the level shifter circuit 20 is changed to the high level. So, the P-FET 14 turns on, and the P-FET 15 turns off. In addition, the driving signal is input into the gate of the N-FET 18 via the buffer 25, and the N-FET 18 turns off when the driving signal is changed to the low level.

As a result, a current kI1 of k times of the current I1 flows through the P-FET 16 which is configured as the current mirror circuit along with the P-FET 12, and the current kI1 is injected into the gate of the IGBT 21. By this, the IGBT 21 can be turned on via the constant current source 1, and temperature dependency of charging velocity of the gate of the IGBT 21 can be reduced. Because of this, while suppressing noise in high temperature, noise and loss can also be suppressed at room temperature.

Here, the P-FET 11 is connected in series to the P-FET 13, and current flowing through the P-FET 11 flows through the P-FET 13 to the resistor 22. When the P-FET 16 changes from OFF to ON, the gate potential of the IGBT 21 changes from the ground potential GND to the power supply potential Vcc, and potential difference between the source and the drain of the P-FET 16 changes from the power supply potential Vcc to zero voltage.

The gate potential of the IGBT 21 is input into the gate of the P-FET 13, and the voltage approximately the same as the gate potential of the IGBT 21 is applied to the drain of the P-FET 11, so that the drain potential of the P-FETs 11 and 16 can be kept approximately same each other by having kept the gate potential of the P-FETs 11 and 16 same each other even when the gate potential of the IGBT 21 varies. Whereby, even when the gate voltage of the IGBT 21 varies, current balance of the current mirror circuit of the P-FETs 11 and 16 can be maintained, and current flowing through the P-FET 13 can be kept constant, so that the IGBT 21 can be driven in a stable manner.

Figure 3:
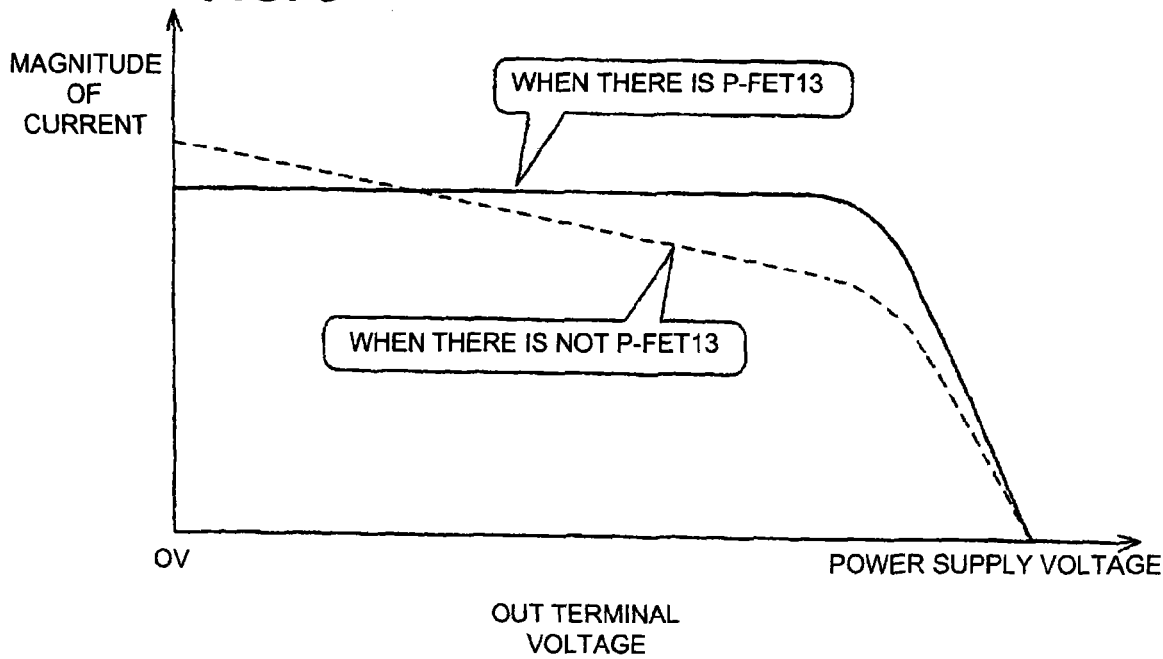
FIG. 3 is a view showing output characteristics when there is a P-FET 13 of FIG. 1 and when there is not the P-FET 13 of FIG. 1.

FIG. 3 is a view showing output characteristics when there is the P-FET 13 of FIG. 1 and when there is not the P-FET 13 of FIG. 1. In FIG. 3, when there is no P-FET 13 and the gate potential of the IGBT 21 varies from the ground potential GND to the power supply potential Vcc, the drain potential of P-FET 11 becomes constant although potential difference between the source and the drain of the P-FET 16 varies from the power supply potential Vcc to zero voltage, and current balance of the current mirror circuit of the P-FETs 11 and 16 is lost, so that the magnitude of current flowing through the P-FET 16 varies depending upon the gate potential of the IGBT 21 (OUT terminal voltage of the drive circuit).

On the other hand, when there is the P-FET 13 and the gate potential of the IGBT 21 varies from the ground potential GND to the power supply potential Vcc, the voltage approximately the same as the gate potential of the IGBT 21 can be applied to the drain of the P-FET 11 and current balance of the current mirror circuit of the P-FETs 11 and 16 can be maintained, so that the magnitude of current flowing through the P-FET 16 can be kept constant without depending upon the gate potential of the IGBT 21 (OUT terminal voltage of the drive circuit).

Meanwhile, the output terminal B of the level shifter circuit 20 changes to the high level, and the inverting output terminal $\overline{B}$ of the level shifter circuit 20 changes to the low level when the driving signal changes to the high level in FIG. 1. So, the P-FET 14 turns off, and the P-FET 15 turns on. In addition, the driving signal also is input into the gate of the N-FET 18 via the buffer 25, and when the driving signal changes to the high level, the N-FET 18 turns on. As a result, the power supply potential Vcc is input into the gate of the P-FET 16, and the P-FET 16 turns off, and charge of the gate of the IGBT 21 is pulled out via the N-FET 18.

Figure 4:
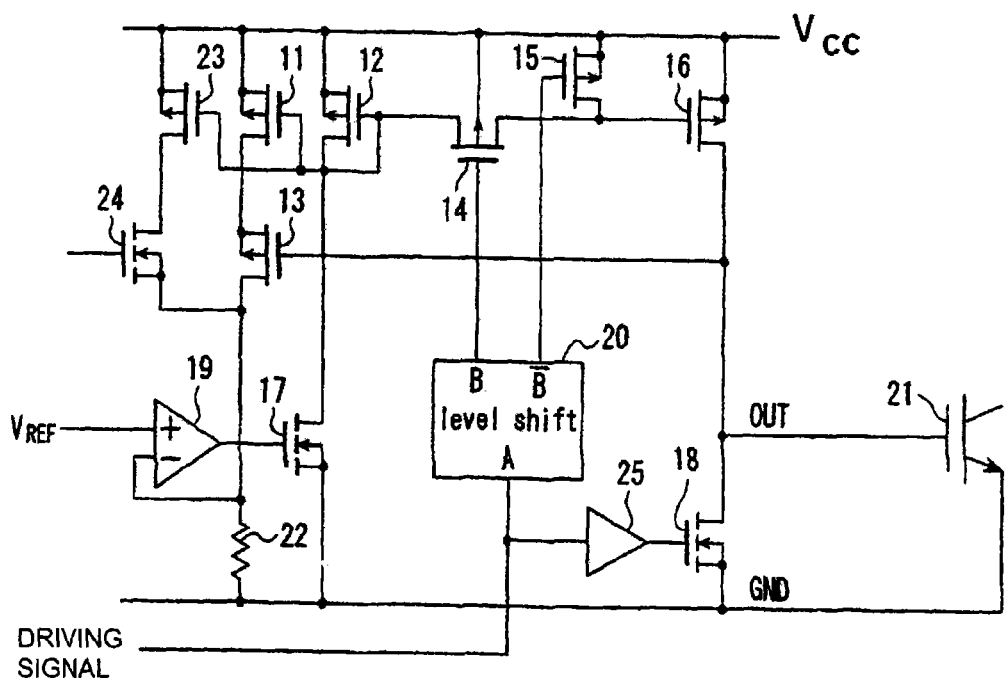
FIG. 4 is a view showing the circuit configuration of a drive circuit for the insulated gate device according to a second embodiment of the invention.
Figure 5:
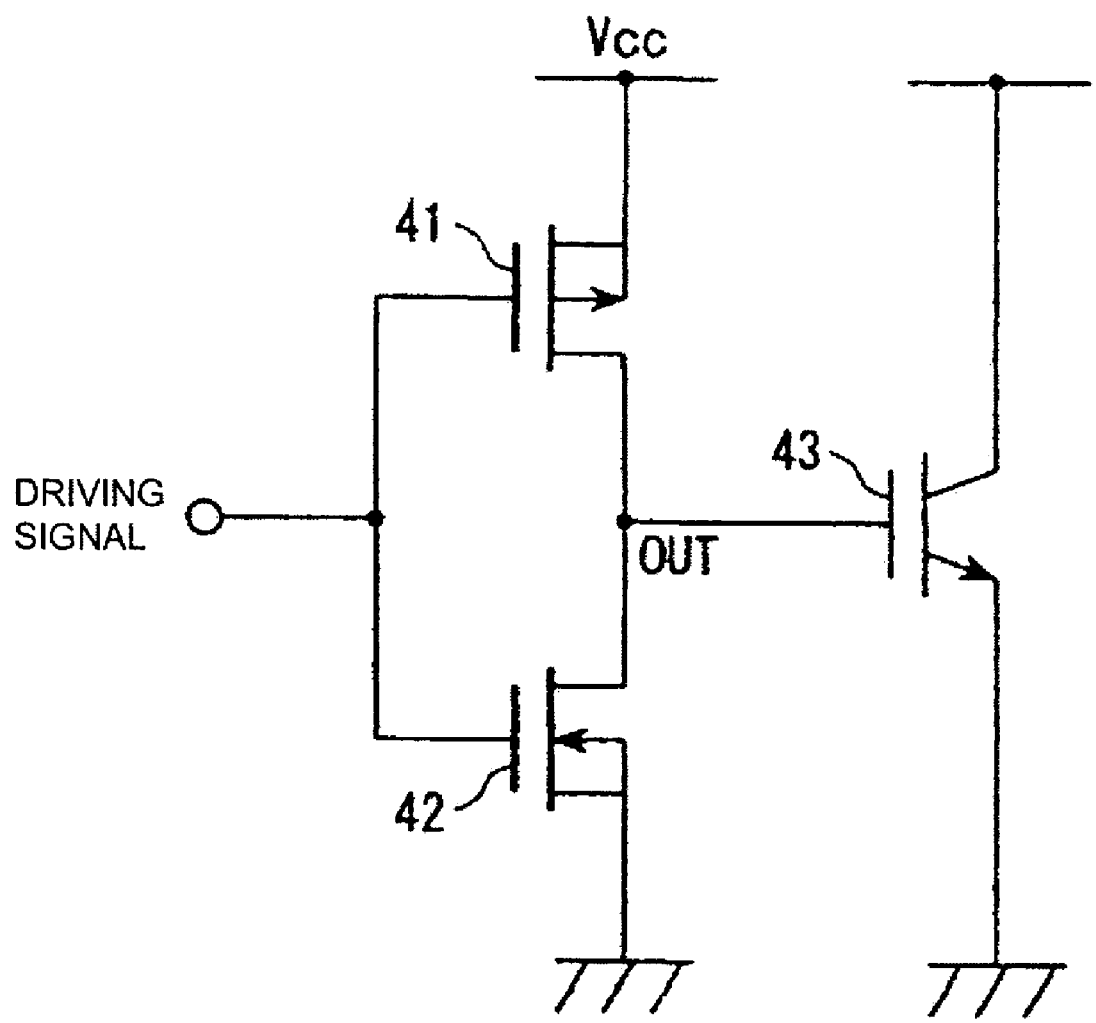
FIG. 5 is a view showing the circuit configuration of a conventional drive circuit for the insulated gate device.

FIG. 4 is a view showing the circuit configuration of a drive circuit for the insulated gate device according to a second embodiment of the invention. In FIG. 4, a P-FET 23 and an N-FET 24 are included in addition to the drive circuit for the IGBT 21 of FIG. 1. Here, a source of the P-FET 23 is connected to the power supply potential Vcc, and a drain of the P-FET 23 is connected to a drain of the N-FET 24. A gate of the P-FET 23 is connected to the gate of the P-FET 11. In addition, a source of the N-FET 24 is connected to the drain of the P-FET 13.

Here, when the gate potential of the IGBT 21 (OUT terminal voltage of the drive circuit) approaches the power supply potential Vcc, the gate potential of the N-FET 24 can be controlled so that the N-FET 24 turns on. For example, when the gate potential of the IGBT 21 has become (Vcc-2) volts, the N-FET 24 can be controlled so that the N-FET 24 turns on.

Current flows through the resistor 22 to the P-FET 23 configured as the current mirror circuit along with the P-FET 11 when the N-FET 24 turns on. Because of this, because the gate potential of the IGBT 21 approaches the power supply potential Vcc, even when the P-FET 13 turns off, current can flow to the resistor 22 connected to the drain of P-FET 13, and it is possible to prevent overcurrent from flowing to the P-FET 12, so that the IGBT 21 can be driven in a stable manner while suppressing increase of consumption current.

The invention has been described with reference to certain preferred embodiments thereof. It will be understood, however, that modifications and variations are possible within the scope of the appended claims.

What is claimed is:

1. A drive circuit for an insulated gate device comprising:
a constant current source that generates a constant current; and
a switching circuit, wherein a gate of the insulated gate device is connected to a power supply potential side via the constant current source at the time of turn-on and the gate of the insulated gate device is connected to a ground potential side at the time of turn-off;
wherein the constant current source comprises a first transistor including a drain side is coupled to a resistor, a second transistor which is configured as a current mirror circuit along with the first transistor and which generates the constant current determined by the value of the resistor and a reference voltage, and a third transistor which is configured as the current mirror circuit along with the second transistor and including a drain which is connected to the gate of the insulated gate device; and
wherein the constant current source includes a bias circuit which the voltage substantially according with a gate voltage of the insulated gate device is applied to a drain of the first transistor.

2. The drive circuit for the insulated gate device according to claim 1, wherein the channel length of the first transistor to the third transistor is substantially the same, and the channel width of the third transistor is equal to or more than ten times the channel width of the second transistor.

3. The drive circuit for the insulated gate device according to claim 2, wherein temperature characteristics of the resistor and the reference voltage are equal to or less than 100 ppm/° C.

4. The drive circuit for the insulated gate device according to claim 1, wherein temperature characteristics of the resistor and the reference voltage are equal to or less than 100 ppm/° C.

5. A drive circuit for an insulated gate device comprising:
a constant current source that generates a constant current; and
a switching circuit, wherein a gate of the insulated gate device is connected to a power supply potential side via the constant current source at the time of turn-on and the gate of the insulated gate device is connected to a ground potential side at the time of turn-off;
wherein the constant current source comprises a first transistor including a drain side is coupled to a resistor, a second transistor which is configured as a current mirror circuit along with the first transistor and which generates the constant current determined by the value of the resistor and a reference voltage, and a third transistor which is configured as the current mirror circuit along with the second transistor and including a drain which is connected to the gate of the insulated gate device; and
wherein the constant current source further comprises a fourth transistor which is configured as the current mirror circuit along with the first transistor and a fifth transistor which makes switching so that current flowing through the fourth transistor flows to the resistor based on the gate voltage of the insulated gate device.

6. The drive circuit for the insulated gate device according to claim 5, wherein the channel length of the first transistor to the fourth transistor is substantially the same, and the channel width of the third transistor is equal to or more than ten times the channel width of the second transistor.

7. The drive circuit for the insulated gate device according to claim 5, wherein temperature characteristics of the resistor and the reference voltage are equal to or less than 100 ppm/° C.

8. A drive circuit for an insulated gate device comprising:
a constant current source that generates a constant current; and
a switching circuit, wherein a gate of the insulated gate device is connected to a power supply potential side via the constant current source at the time of turn-on and the gate of the insulated gate device is connected to a ground potential side at the time of turn-off;
wherein the constant current source comprises a first transistor including a drain side is coupled to a resistor, a second transistor which is configured as a current mirror circuit along with the first transistor and which generates the constant current determined by the value of the resistor and a reference voltage, and a third transistor which is configured as the current mirror circuit along with the second transistor and including a drain which is connected to the gate of the insulated gate device;
wherein the channel length of the first transistor to the third transistor is substantially the same, and the channel width of the third transistor is equal to or more than ten times the channel width of the second transistor; and
wherein temperature characteristics of the resistor and the reference voltage are equal to or less than 100 ppm/° C.

* * * * *